United States Patent [19]

Suzuki et al.

[11] Patent Number: 5,023,880
[45] Date of Patent: Jun. 11, 1991

[54] SEMICONDUCTOR LASER DEVICE

[75] Inventors: Mariko Suzuki, Yokohama; Kazuhiko Itaya, Tokyo; Masayuki Ishikawa, Nishimine; Yukio Watanabe; Genichi Hatakoshi, both of Yokohama, all of Japan

[73] Assignee: Kabushiki Kaisha Toshiba, Kawasaki, Japan

[21] Appl. No.: 478,961

[22] Filed: Feb. 12, 1990

[30] Foreign Application Priority Data

Feb. 22, 1989 [JP] Japan ................................. 1-40201

[51] Int. Cl.$^5$ .............................................. H01S 3/19
[52] U.S. Cl. ...................................... 372/45; 372/46; 357/16; 357/17
[58] Field of Search ............... 372/45, 46, 43; 357/16, 357/17

[56] References Cited

U.S. PATENT DOCUMENTS 4,740,976 4/1988 Kajimura et al. ..................... 372/45
4,845,724 7/1989 Hayakawa et al. .................... 372/45

Primary Examiner—Georgia Epps
Attorney, Agent, or Firm—Oblon, Spivak, McClelland, Maier & Neustadt

[57] ABSTRACT

A semiconductor laser device including a semiconductor substrate of a first conductivity type, a double hetero structure, including of a lower cladding layer of the first conductivity type, an active layer, and a first upper cladding layer of $In_{1-w}(Ga_{1-y}Al_y)_wP$ of the second conductivity type formed on the semiconductor substrate, a second upper cladding layer of $In_{1-w}(Ga_{1-w}Al_z)_wP$ of the second conductivity type partially formed on the first upper cladding layer, a first contact layer of $In_{1-w}(Ga_{1-s}Al_s)_wP$ ($0<s<z\leq 1$) of the second conductivity type formed on the second upper cladding layer, and a second contact layer of GaAs of the second conductivity type formed on the first upper clad layer and the first contact layer. The value of y in $In_{1-w}(Ga_{1-y}Al_y)_wP$ which constitutes the first upper cladding layer, and the value of z in $In_{1-w}(Ga_{1-z}Al_z)_wP$ which constitutes the second upper cladding layer satisfy a relation $0.6\leq y<z\leq 1$.

19 Claims, 6 Drawing Sheets

SEMICONDUCTOR LASER DEVICE

BACKGROUND OF THE INVENTION

1. Field of the Invention

The present invention relates to a semiconductor laser device.

2. Description of the Prior Art

In recent years, a semiconductor laser device having a short wavelength has been developed for the purpose of application to, e.g., a high density optical disc system, a high speed laser printer, and a bar code reader. Among such semiconductor laser devices each having a short wavelength, in particular, an InGaAlP series semiconductor laser device having an oscillation wavelength in a 0.6 μm band has received a great deal of attention as a promising device.

In order to use a semiconductor laser device as a light source for optical information processing, transverse mode control must be performed. The present inventors manufactured a ridge-buried type semiconductor laser device shown in FIG. 1 as an InGaAlP series semiconductor laser device having a transverse mode control structure to confirm fundamental transverse mode oscillation.

Referring to FIG. 1, an n-type GaAs buffer layer 2, an n-type InGaAlP cladding layer 3, an InGaAlP active layer 4, a p-type InGaAlP cladding layer 5, a p-type InGaP cap layer 6, and a p-type GaAs contact layer 7 are sequentially stacked on an n-type GaAs substrate 1. Electrodes 8a and 8b are formed on both surfaces of the above structure.

When the p-type InGaAlP cladding layer 5 contains a large amount of Al, a large hetero barrier is present at the hetero junction interface between the p-type GaAs contact layer 7 and the p-type InGaAlP cladding layer 5 to cause voltage drop. In view of this, when a p-type InGaP layer having an intermediate band gap as compared with those of p-type GaAs and p-type InGaAlP is formed at the hetero junction interface, a voltage drop can be decreased. In the semiconductor laser device shown in FIG. 1, utilizing such a decrease in voltage drop, the p-type InGaP cap layer 6 is formed at only the interface between the p-type GaAs contact layer 7 and the p-type InGaAlP cladding layer 5, formed on a ridge portion of the p-type InGaAlP clad layer 5, thus blocking a current. In addition, a light guide and a transverse mode are stabilized by forming a ridge in the p-type clad layer 5, and by arranging the p-type GaAs contact layer 7 close to the InGaAlP active layer 4 outside the ridge.

A method of manufacturing the above-mentioned semiconductor laser device will be described hereinafter with reference to FIGS. 2A and 2B.

First MOCVD (metal organic chemical vapor deposition is performed to sequentially form the n-type GaAs buffer layer 2, the n-type InGaAlP cladding layer 3, the InGaAlP active layer 4, the p-type InGaAlP cladding layer 5, and the p-type InGaP cap layer 6 on the n-type GaAs substrate 1. Then, a resist pattern 9 is formed on the above structure (FIG. 2A).

Using the resist pattern 9 as a mask, the p-type InGaP cap layer 6 is etched using a stirrer in an aqueous solution containing $Br_2$ and HBr. In addition, the p-type InGaAlP cladding layer 5 is etched by hot phosphoric acid at 60° to 80° C. to form a ridge (FIG. 2B).

After the resist pattern 9 is removed, the p-type GaAs contact layer 7 is formed by second MOCVD, thus completing a ridge-buried type semiconductor laser device shown in FIG. 1.

The semiconductor laser device thus manufactured is promising as a device having excellent performance. However, when the above-mentioned manufacturing method is employed, it is difficult to manufacture the device at high production yield. More specifically, in the above-mentioned etching process, it is difficult to control a thickness h of each portion of the p-type InGaAlP cladding layer 5 located on both sides of the ridge, which largely affects transverse mode control, due to unstability of an etching rate. In addition, a large variation in etching amount in the wafer surface occurs.

SUMMARY OF THE INVENTION

It is an object of the present invention to provide a semiconductor laser device which can precisely control the dimensions of the device, thereby improving characteristics and a production yield.

According to the present invention, there is provided a semiconductor laser device comprising a semiconductor substrate of a first conductivity type, a double hetero structure, consisting of a lower cladding layer of the first conductivity type, an active layer, and a first upper cladding layer of $In_{1-w}(Ga_{1-y}Al_y)_wP$ of a second conductivity type, formed on the semiconductor substrate, a second upper cladding layer of $In_{1-w}(Ga_{1-z}Al_z)_wP$ of the second conductivity type partially formed on the first upper cladding layer, a first contact layer of $In_{1-w}(Ga_{1-s}Al_s)_wP$ ($0 \leq s < z \leq 1$) of the second conductivity type formed on the second upper cladding layer, and a second contact layer of GaAs of the second conductivity type formed on a first upper cladding layer and the first contact layer.

The value of y in $In_{1-w}(Ga_{1-y}Al_y)_wP$ which constitutes the first upper cladding layer, and the value of z in $In_{1-w}(Ga_{1-z}Al_z)_wP$ which constitutes the second upper cladding layer satisfy a relation $0.6 \leq y < z \leq 1$.

According to the present invention, there is provided a method of manufacturing a semiconductor laser device comprising the steps of:

sequentially forming a lower cladding layer of a first conductivity type, an active layer, a first upper cladding layer of $In_{1-w}(Ga_{1-y}Al_y)_wP$ of a second conductivity type, a second upper cladding layer of $In_{1-w}(Ga_{1-z}Al_z)_wP$ the second conductivity type, and a first contact layer of $In_{1-w}(Ga_{1-s}Al_s)_wP$ ($0 \leq s < z \leq 1$) of the second conductivity type, on a semiconductor substrate of the first conductivity type; and forming a second contact layer of GaAs of the second conductivity type on the first upper cladding layer and the first contact layer.

The value of y in $In_{1-w}(Ga_{1-y}Al_y)_wP$ which constitutes the first upper cladding layer and the value of z in $In_{1-w}(Ga_{1-z}Al_z)_wP$ which constitutes the second upper cladding layer satisfy a relation $0.6 \leq y < z \leq 1$.

According to the semiconductor laser device of the present invention, dimensions can be controlled with high accuracy while good current blocking is maintained.

According to the method of manufacturing the semiconductor laser device of the present invention, a high reliability semiconductor laser device having a low threshold value can be manufactured at high yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A semiconductor laser device according to the present invention includes a semiconductor substrate of a first conductivity type, a double hetero structure, consisting of a lower cladding layer of the first conductivity type, an active layer, and a first upper cladding layer, formed on the semiconductor substrate, a second upper cladding layer partially formed on the first upper cladding layer, a first contact layer formed on the second upper cladding layer, and a second contact layer formed on a first upper clad layer and the first contact layer.

More specifically, in the semiconductor laser device according to the present invention, the conventional cladding layer with the single composition formed on the active layer is constituted by a first upper cladding layer of $In_{1-w}(Ga_{1-y}Al_y)_wP$ and a ridge-shaped second upper cladding layer of $In_{1-w}(Ga_{1-z}Al_z)_wP$. The values of y and z satisfy a relation $0.6 \leq y < z \leq 1$. The value of w preferably satisfies relation $0.50 < w \leq 0.54$.

In the above semiconductor laser device according to the present invention, the first upper cladding layer of $In_{1-w}(Ga_{1-y}Al_y)_wP$ has a function for generating a due to discontinuity of a band at a hetero junction between the first upper cladding layer and the second contact layer formed thereon to cause current blocking. The first upper cladding layer of $In_{1-w}(Ga_{1-y}Al_y)_wP$ also exhibits a function as an etching stopping layer when the ridge-shaped second upper cladding layer of $In_{1-w}(Ga_{1-z}Al_z)_wP$ is formed by selective etching.

As a result, according to the present invention, the dimensions of an element can be controlled with high accuracy while good current blocking is maintained. Therefore, a high reliability semiconductor laser device having a low threshold value and excellent characteristics can be manufactured at high production yield.

Various preferred embodiments of the present invention will be described hereinafter.

Figure 3:
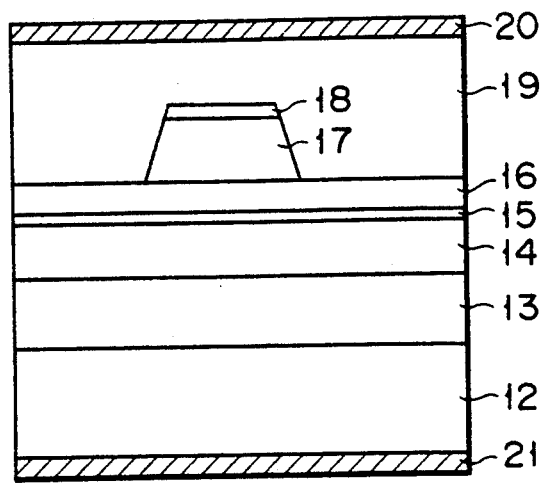
FIG. 3 is a sectional view showing a structure of a semiconductor laser device according to the first embodiment of the present invention.

FIG. 3 is a schematic sectional view of a semiconductor laser device according to one embodiment of the present invention. In the semiconductor laser device shown in FIG. 3, an n-type GaAs buffer layer 13 is formed on an n-type GaAs substrate 12. A double hetero structure is formed on the n-type GaAs buffer layer 13. This double hetero structure consists of a cladding layer 14 of n-type $In_{0.5}Ga_{0.15}Al_{0.35}P$ (n-type $In_{1-w}(Ga_{1-v}Al_v)_wP$, $0 \leq V \leq 1$, and $0.50 \leq w \leq 0.54$), an active layer 15 of $In_{0.5}Ga_{0.5}P$ ($In_{1-w}(Ga_{1-x}Al_x)_wP$, $0 \leq x < v \leq 1$, and $0.50 \leq w < 0.54$), a first cladding layer 16 of p-type $In_{0.5}Ga_{0.15}Al_{0.35}P$ ($In_{1-w}(Ga_{1-y}Al_y)_wP$, $0 \leq x < y \leq 1$, and $0.50 \leq w \leq 0.54$) and a second cladding layer 17 of p-type $In_{0.5}Al_{0.5}P$ ($In_{1-w}(Ga_{1-z}Al_z)_wP$, $0.6 \leq y \leq z \leq 1$, and $0.50 < w < 0.54$) which is partially formed into a stripe shape (Al content of each layer has a relationship of $0 \leq x < v$, and $y \leq 1$). An intermediate (first) contact layer 18 of p-type $In_{0.5}Ga_{0.5}P$ ($In_{1-w}(Ga_{1-s}Al_s)_wP$, $0 \leq s < z \leq 1$, and $0.50 \leq w \leq 0.54$) is formed on the second upper cladding layer 17 patterned into a stripe shape. A p-type GaAs (second) contact layer 19 is formed on the entire surface of the above structure. An Au/Zn electrode 20 is formed on the p-type GaAs contact layer 19, and an Au/Ge electrode 21 is formed on the lower surface of the n-type GaAs subtrate 12. Note that the contents of In, Ga, and Al are determined so that a lattice constant of each of the n-type cladding layer 14, the active layer 15 and the first cladding layer 16 serving as the double hetero structure section, and the intermediate contact layer 18 is substantially the same as that of the GaAs substrate 12 (w in each layer satisfies $0.50 \leq w \leq 0.54$), and that a band gap energy of each of the cladding layer 14 and the first cladding layer 16 is larger than that of the active layer 15.

A characteristic feature of the semiconductor laser device according to the present invention shown in FIG. 3 is as follows. The first upper cladding layer 16 of p-type $In_{0.5}Ga_{0.15}Al_{0.35}P$, serving as an upper cladding layer of the double hetero structure, has a function for generating a barrier due to band discontinuity at on the hetero junction interface between the first upper cladding layer 16 and the p-type GaAs contact layer 19 to cause current blocking, and also has a function as an etching stopping layer required when the second upper cladding layer 17 of p-type $In_{0.5}Al_{0.5}P$ is etched into a mesa stripe shape.

Note that in order to perform an operation as a semiconductor laser device, ohmic contacts with small resistances are respectively achieved between the first upper cladding layer 16 of p-type $In_{0.5}Ga_{0.15}Al_{0.35}P$ and the second upper cladding layer 17 of p-type $In_{0.5}Al_{0.5}P$, between the second upper cladding layer 17 and the intermediate contact layer 18 of p-type InGaP, and between the intermediate contact layer 18 and the contact layer 19 of p-type GaAs.

A method of manufacturing the semiconductor laser device shown in FIG. 3 will be described hereinafter.

Figure 4A:
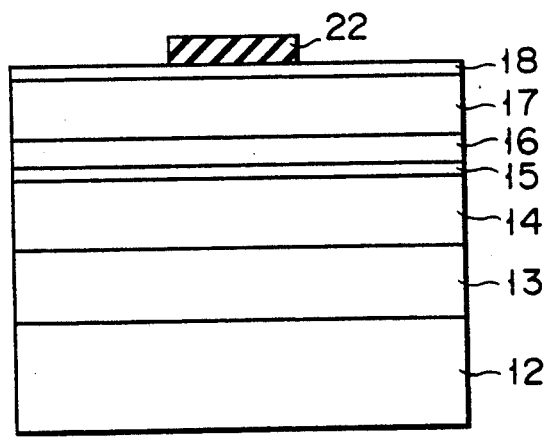
FIGS. 4A and 4B are sectional views showing the steps in manufacturing the semiconductor laser device shown in FIG. 3.
Figure 4B:
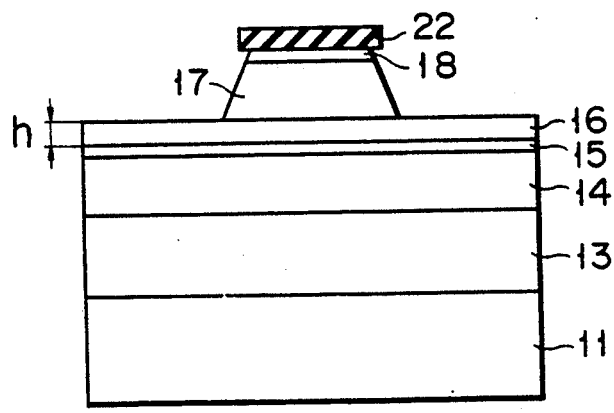

FIGS. 4A and 4B are sectional views showing the steps in manufacturing the semiconductor laser device shown in FIG. 3. As shown in FIG. 4A, a 0.5-$\mu$m thick first buffer layer 13 of n-type GaAs (Si doping, carrier concentration: 3 to $5 \times 10^{17}$ atoms/cm$^3$), 0.8-$\mu$m thick cladding layer 14 of n-type $In_{0.5}Ga_{0.15}Al_{0.35}P$ (Si doping, carrier concentration: 3 to $5 \times 10^{17}$ atoms/cm$^3$), a 0.06-$\mu$m thick active layer 15 of $In_{0.5}Ga_{0.5}P$ (non-doped), a first upper cladding layer 16 of p-type $In_{0.5}Ga_{0.15}Al_{0.35}P$ having a thickness of 0.2 to 0.3$\mu$m (Zn doping, carrier concentration: 3 to $5 \times 10^{17}$ atoms/cm$^3$), a second cladding layer 17 of p-type $In_{0.5}Al_{0.5}P$ having a thickness of 0.5$\mu$m (Zn doping, carrier concentration: 3 to $5 \times 10^{17}$ atoms/cm$^3$ and a 500-Å thick intermediate contact layer 18 of p-type $In_{0.5}Ga_{0.5}P$ (Zn doping, carrier concentration: $1 \times 10^{18}$ atoms/cm$^3$) are sequentially grown on an n-type GaAs substrate 12 (Si doping, carrier concentration: $3 \times 10^{18}$ atoms/cm$^3$) having a surface orientation (100) by MOCVD (metal organic chemical vapor deposition), thus forming a double hetero wafer. A resist film of SiO$_2$ is formed on the entire surface of the intermediate contact layer 18 of p-type $In_{0.5}Ga_{0.5}P$ by CVD. This resist film is patterned by a PEP process to form an SiO$_2$ film 22 having a width of 5 to 7 $\mu$m into a stripe shape.

As shown in FIG. 4B, using the SiO$_2$ film 22 patterned into a stripe shape as a mask, the intermediate contact layer 18 of p-type $In_{0.5}Ga_{0.5}P$ is partially etched into a stripe pattern by a solution mixture of hydrobromic acid, bromine and water. Then using the intermediate contact layer 18 etched into a stripe pattern as a mask, the second upper cladding layer 17 is etched by hot sulfuric acid or hot phosphoric acid at 60° to 80° C. to form ridge stripes (mesa stripes). An InGaAlP selective etchant of hot sulfuric acid or hot phosphoric acid has a property that the smaller the Al content is, the lower the etching rate (i.e., the larger the Al content is, the higher the etching rate). When the etchant is used at a proper temperature, e.g., 15° to 130° C., the first upper cladding layer 16 serves as an etching stopper. Therefore, a thickness h of the first upper cladding layer 16 can be controlled to be a desired value, resulting in excellent mode control. Then, after the SiO$_2$ film 22 etched into a stripe pattern is removed, phosphorus hydride and an organic compound of In, e.g., TMI (trimethyl iodide, TEI (triethyl iodide), are supplied to a growth room, and the wafer is heated and held at about 800° C. in a vapor atmosphere containing P and In to remove a surface oxide film of the wafer. As shown in FIG. 3, thereafter, a 3-$\mu$m thick p-type GaAs contact layer 19 (Zn doping, carrier concentration: $3 \times 10^{18}$ atoms/cm$^3$) is formed on the first upper cladding layer 16, side walls of the second upper cladding layer 17 patterned into a stripe shape, and the intermediate contact layer 18 by MOCVD. Then, an Au/Zn electrode 20 is deposited on the upper surface of the p-type GaAs contact layer 19, and an Au/Ge electrode 21 is deposited on the lower surface of the n-type GaAs substrate 12, thus obtaining the semiconductor laser device shown in FIG. 3.

Figure 5:
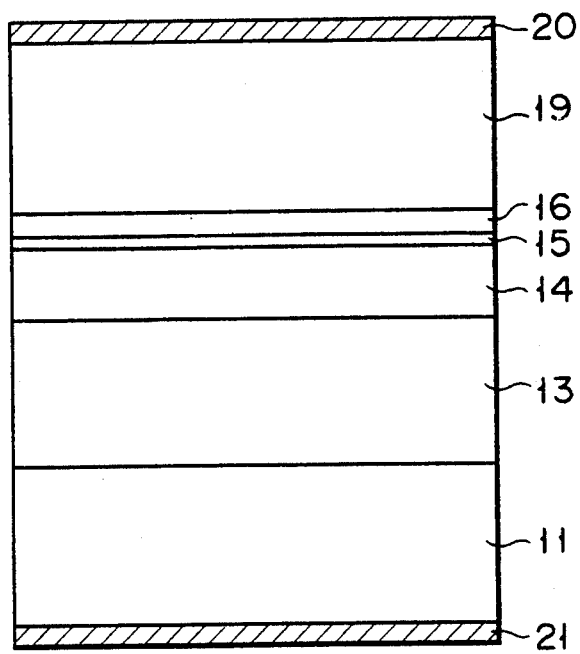
FIG. 5 is a sectional view showing a structure of a current blocking section.
Figure 6:
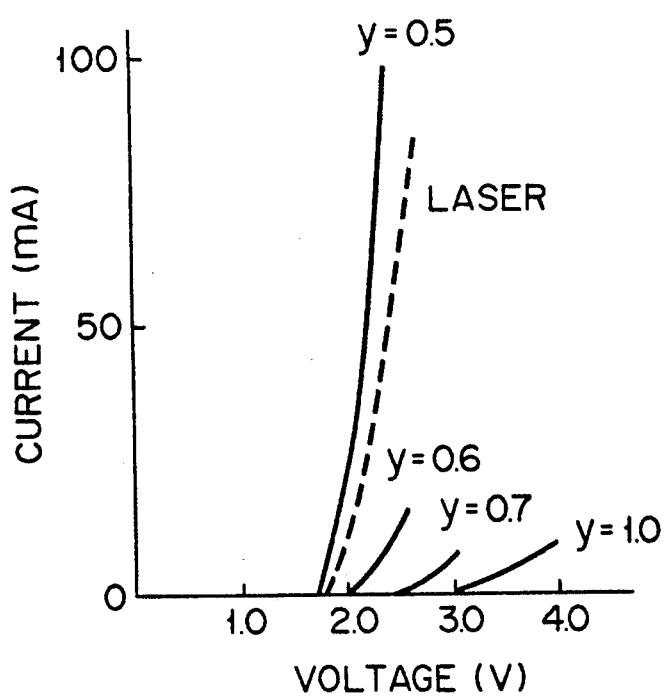
FIG. 6 is a graph showing current - voltage curves of the current blocking section shown in FIG. 5.

In the semiconductor laser device shown in FIG. 3, when the first upper cladding layer 16 of p-type $In_{0.5}Ga_{0.15}Al_{0.35}P$ forms a barrier due to band discontinuity on the hetero junction interface between the first upper cladding layer 16 and the contact layer 19 of p-type GaAs, the following conditions must be satisfied. FIG. 5 shows a current blocking section of the semiconductor laser device shown in FIG. 3 in which the second upper cladding layer 17 of p-type $In_{0.5}Al_{0.5}P$, patterned into a stripe shape, and the p-type InGaP intermediate contact layer 18 of p-type InGaP are not present. The size of this current blocking section is 300 × 300 $\mu$m$^2$. This size is substantially the same as that obtained when this portion serves as an element of the semiconductor laser device. The same reference numerals in FIG. 5 denote the same parts as in FIG. 3. FIG. 6 shows current-voltage characteristics of the current blocking section shown in FIG. 5. An Al content y of the first cladding layer 16 of p-type $In_{1-w}(Ga_{1-y}Al_y)_wP$ is changed as a parameter.

Figure 1:
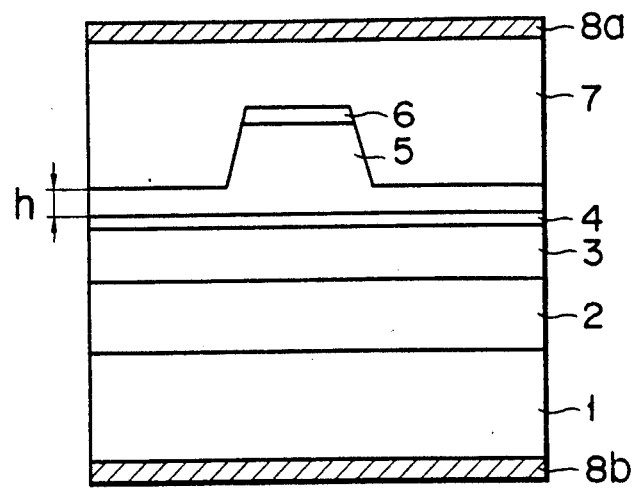
FIG. 1 is a sectional view showing a structure of a conventional semiconductor laser device.

Note that a carrier concentration of the first upper cladding layer 16 of p-type $In_{1-w}(Ga_{1-y}Al_y)_wP$ is $3 \times 10^{17}$ atoms/cm$^3$. As shown in FIG. 6, when the Al content y is gradually decreased such that y=1.0, 0.7, 0.6, 0.5, ..., a current is more easily supplied to the current blocking section shown in FIG. 5. A dotted line in FIG. 6 represents current-voltage characteristics obtained when the InGaAlP series semiconductor laser device (a contact area: $5 \times 300$ cm$^2$) shown in FIG. 1 is operated at a voltage of about 2.0 to 2.5 V. As is understood from FIG. 6, when the Al content y falls within the range of 0.6 to 1.0, a voltage drop required for current blocking of the semiconductor laser device can be obtained. However, when y<0.5, a current of $1 \times 10$ to $1 \times 10^2$ mA or more is supplied to the current blocking section at an operation voltage, and a voltage drop required for current blocking cannot be obtained. Therefore, in order to obtain a voltage drop required for current blocking, the Al content y must be defined to satisfy y>0.6.

In order that the first upper cladding layer 16 of p-type $In_{1-w}(Ga_{1-y}Al_y)_wP$ shown in FIG. 3 has a function as an etching stopping layer required when the second upper cladding layer 17 of p-type $In_{1-w}(Ga_{1-z}Al_z)_wP$ is etched, an Al content of the upper second cladding layer 17 must be larger than that of the first upper cladding layer 16. Therefore, an Al content y of the first upper cladding layer 16 of p-type $In_{1-w}(Ga_{1-y}Al_y)_wP$ is defined as $0.6 \leq y \leq 1$ for current blocking, and a relationship between the Al content y of the first upper cladding layer 16 and the Al content z of the second upper cladding layer 17 is defined as $0.6 \leq y \leq z < 1$. Therefore, a relationship between the Al contents y and z must be defined as $0.6 \leq y < z \leq 1$.

Note that, in the above embodiment, a buffer layer of n-type $In_{0.5}Ga_{0.5}P$ ($In_{1-w}(Ga_{1-p}Al_p)_wP$, $0.50 \leq w \leq 0.54$, and $0 \leq p \leq 1$) may be formed between the n-type buffer layer 13 and the n-type cladding layer 14.

As described above, according to the present invention, the thickness of the cladding layer for mode control can be controlled to be a desired value without obstructing current blocking. Therefore, an InGaAlP series visual semiconductor laser device having a stable lateral mode can be manufactured at high production yield.

Figure 7:
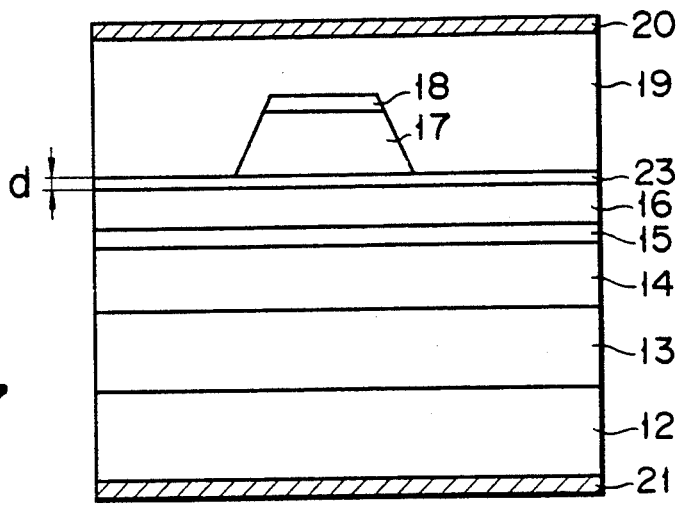
FIG. 7 is a sectional view showing a structure of a semiconductor laser device according to the second embodiment of the present invention.

The second embodiment will be described below with reference to FIG. 7. In FIG. 7, an etching stopping layer 23 of p-type $In_{0.5}Ga_{0.5}P$ $(In_{1-w}(Ga_{1-u}Al_u)_w P$, $0 \leq u < z \leq 1$, and $0.50 \leq w \leq 0.54$) is formed on a cladding layer 16 of p-type $In_{0.5}Ga_{0.15}Al_{0.35}P$ in the semiconductor laser device shown in FIG. 3.

In this embodiment, an Al content y of the first upper cladding layer 16 is defined as $0.6 \leq y \leq 1$ to provide a current blocking function. In addition, an Al content u of the etching stopping layer 23 is defined as $0 \leq u \leq z \leq 1$ to allow the layer 23 to function as an etching stopper.

Figure 8A:
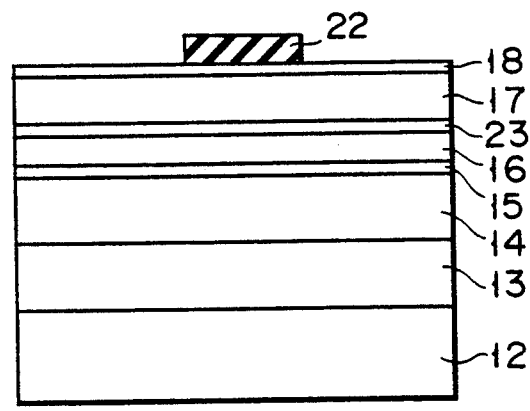
FIGS. 8A and 8B are sectional views showing the steps in manufacturing the semiconductor laser device shown in FIG. 7.

A method of manufacturing a semiconductor laser device shown in FIG. 7 will be described below with reference to FIGS. 8A and 8B. As shown in FIG. 8A, in the same manner as in the steps shown in FIG. 4A, an n-type GaAs buffer layer 13, a cladding layer 14 of n-type $In_{0.5}Ga_{0.15}Al_{0.35}P$, an active layer 15 of $In_{0.5}Ga_{0.5}P$, and a first upper cladding layer 16 of p-type $In_{0.5}Ga_{0.15}Al_{0.35}P$ are sequentially stacked on an n-type GaAs substrate 12. After a 50-Å thick etching stopping layer 23 of p-type InGaP is formed on the above structure, a second upper cladding layer 17 of p-type $In_{0.5}Al_{0.5}P$ and an intermediate contact layer 18 of p-type $In_{0.5}Al_{0.5}P$ are sequentially formed by MOCVD. Then, after a resist film of $SiO_2$ is formed on the intermediate contact layer 18 of p-type $In_{0.5}Ga_{0.5}P$, this resist film is patterned into a stripe shape, thus forming an $SiO_2$ film 22.

Figure 8B:
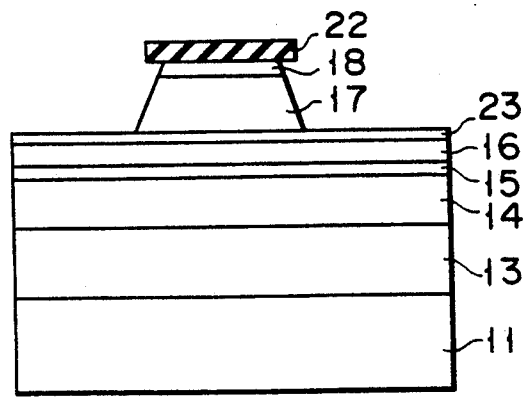
Figure 9:
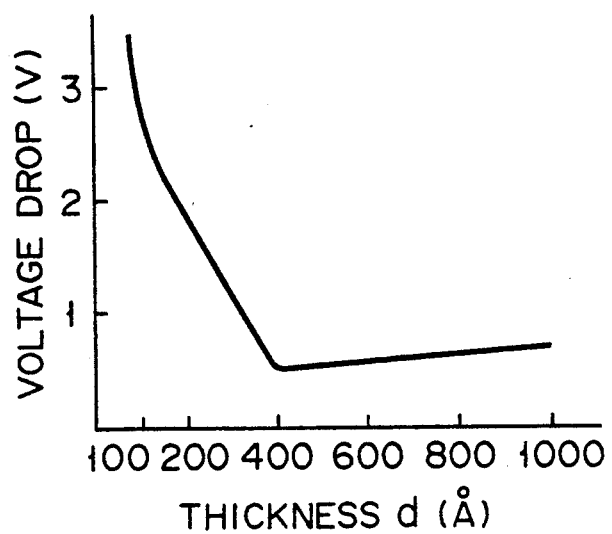
FIG. 9 is a graph showing voltage drop which occurs when the thickness of an etching stopping layer is varied in the semiconductor laser device shown in FIG. 7.

As shown in FIG. 8B, the intermediate contact layer 18 of p-type $In_{0.5}Ga_{0.5}P$ is etched into a stripe pattern by a solution mixture of hydrobromic acid, bromine and water, and the second upper cladding layer 17 of p-type $In_{0.15}Al_{0.5}P$ is etched into a stripe pattern by hot sulfuric acid or hot phosphoric acid. Thereafter, the surface oxide film is removed in the same manner as in the steps in FIG. 4A, and a contact layer 19 of p-type GaAs is formed by MOCVD. Au/Zn and Au/Ge electrodes 20 and 21 are formed on the upper and lower surfaces, respectively, of the structure. In order that the etching stopping layer 23 of p-type InGaP has a function as an etching stopper to etch the second upper cladding layer 17 of p-type InAlP into a stripe pattern, an Al content of the etching stopping layer 23 is set smaller than that of the second upper cladding layer 17 of p-type InAlP. In order that the first upper cladding layer 16 of p-type $In_{0.5}Ga_{0.15}Al_{0.35}P$ serving as a lower layer has a current blocking function with respect to the contact layer 19 of p-type GaAs in the same manner as in FIG. 3, the thickness of the etching stopping layer 23 of p-type InGaP may be set to be 100 Å or less. FIG. 9 shows voltage drop V generated across the first upper cladding layer 16, the etching stopping layer 23, and the contact layer 19, when a thickness d of the etching stopping layer 23 of p-type InGaP is varied. In the InGaAlP series semiconductor laser device, an operation voltage of about 2.0 V or more is required. In order to perform excellent current blocking during an operation of the device, a voltage drop of 2.5 V or more is required. As is understood from FIG. 9, therefore, in order to obtain such a voltage drop, the thickness d of the etching stopping layer 23 of p-type InGaP must be 100 Å or less.

Figure 10:
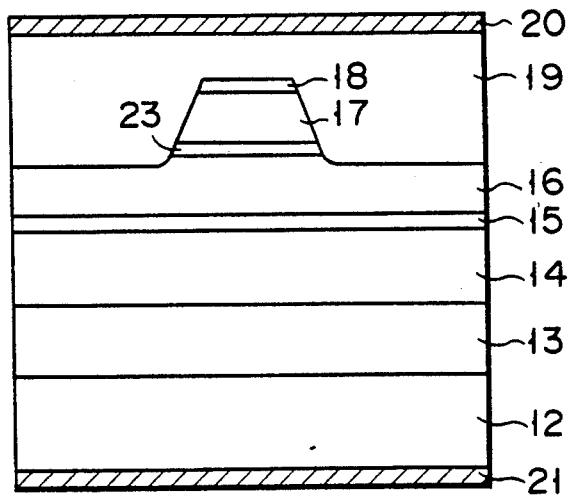
FIG. 10 is a sectional view showing a structure of a semiconductor laser device according to the third embodiment of the present invention.

The third embodiment will be described below with reference to FIG. 10. A semiconductor laser device shown in FIG. 10 is obtained by removing an etching stopping layer 23 of p-type InGaP located on both sides of a ridge portion from the semiconductor laser device shown in FIG. 7, except for the layer portion formed under the second upper cladding layer 17 of p-type $In_{0.5}Al_{0.5}P$ patterned stripe shape. A method of manufacturing the semiconductor laser device shown in FIG. 10 will be described below. Initial steps are the same as in FIGS. 8A and 8B. In the third embodiment, as shown in FIG. 11, the etching stopping layer 23 formed on both the sides of the mesa stripe is further etched from the structure shown in FIG. 8B by a solution mixture of hydrobromic acid, bromine and water using an $SiO_2$ film 22 as a mask.

The thickness of the etching stopping layer 23 is as small as 100 Å, and an etching time period in this step is as short as 5 sec. Therefore, the thickness of a first cladding layer 16 and the ridge width of a second upper cladding layer 17 are hardly affected. As a result, these layers can be formed with excellent reproducibility. Thereafter, a surface oxide film is removed. As shown in FIG. 10, a contact layer 19 of p-type GaAs is formed on the first upper cladding layer 16, the side walls of the second cladding layer 17, and an intermediate contact layer 18 by MOCVD. Au/Zn and Au/Ge electrodes 20 and 21 are formed on the upper and lower surfaces, respectively, of the structure.

Figure 2A:
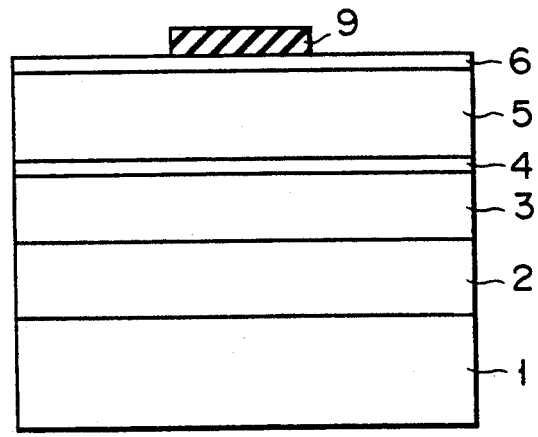
FIGS. 2A and 2B are sectional views showing the steps i manufacturing the conventional semiconductor laser device shown in FIG. 1.
Figure 2B:
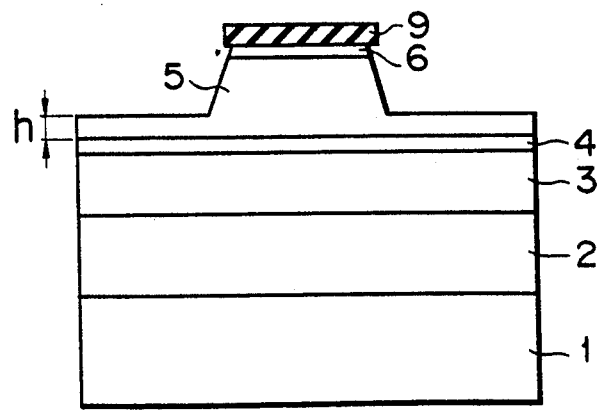
Figure 11:
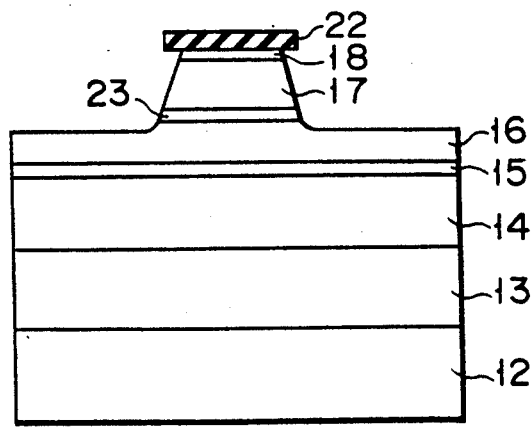
FIG. 11 is a sectional view showing the steps in manufacturing the semiconductor laser device shown in FIG. 10.

As described above, according to a structure and a manufacturing method shown in FIGS. 10 and 11, a semiconductor laser device having a threshold value of 40 to 45 mA, and an astigmatism of about 10 μm can be obtained. Note that the thickness of the cladding layer could not be satisfactorily controlled by the structure and the manufacturing method shown in FIGS. 1 to 2B, and hence the threshold value largely varied from 40 to 70 mA, and the astigmatism from 5 to 30 μm.

Figure 12:
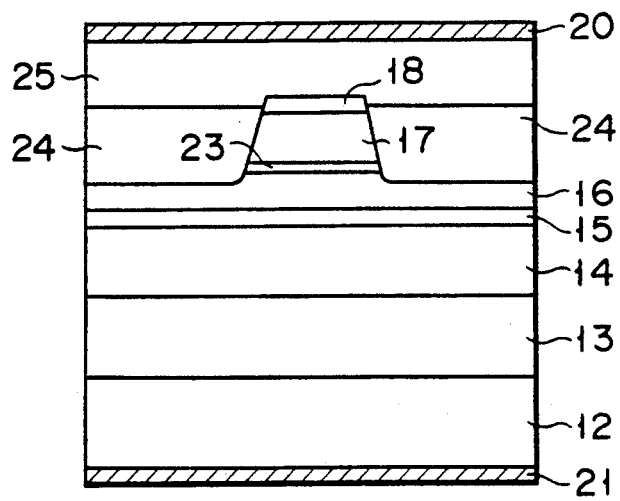
FIG. 12 is a sectional view showing a structure of a semiconductor laser device according to the fourth embodiment of the present invention.

The fourth embodiment will be described hereinafter. FIG. 12 is a schematic sectional view of a semiconductor laser device according to the fourth embodiment. In FIG. 12, a current blocking layer 24 of n-type GaAs $(Ga_{1-R}Al_R As$, $0 \leq R \leq 1)$ having a current blocking function is formed on both sides of an etching stopping layer 23 of p-type $In_{0.5}Ga_{0.5}P$ and a second upper cladding layer 17 of p-type InAlP which constitute a mesa stripe shown in FIG. 10. A p-type GaAs contact layer 25 is formed on the n-type GaAs current blocking layer 24 and a p-type InGaP intermediate contact layer 18.

Figure 13:
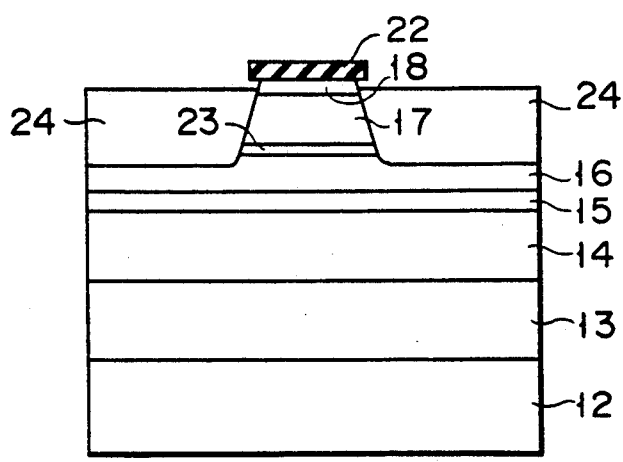
FIG. 13 is a sectional view showing the steps in manufacturing the semiconductor laser device shown in FIG. 12.

A method of manufacturing the semiconductor laser device shown in FIG. 12 will be described hereinafter. The initial steps are the same as in FIGS. 8A, 8B, and 11. In the fourth embodiment, as shown in FIG. 13, selective growth is performed using an $SiO_2$ film 22 as a mask by MOCVD in the state shown in FIG. 11, and the current blocking layer 24 of n-type GaAs is formed on both sides of the etching stopping layer 23 of p-type $In_{0.5}Ga_{0.5}P$ and the second cladding layer 17 of p-type $In_{0.5}Al_{0.5}P$ which constitute a mesa stripe. Thereafter, the $SiO_2$ film 22 is removed, and the contact layer 25 of p-type GaAs is formed by MOCVD. Finally, Au/Zn and Au/Ge electrodes 20 and 21 are formed.

The semiconductor laser device thus manufactured was oscillated at a threshold value of 35 mA when the length of a resonator was set to be 300 μm, and excellent characteristics in a single lateral mode could be obtained up to 20 mW. In a service life test, a stable operation for 2,000 hours or more was confirmed under the conditions of 50° C. and 5 mW. In addition, the above characteristics could be obtained with good reproducibility in a wafer surface having a size of 30×30 mm². Thus, according to the present invention, a semiconductor laser device having good element characteristics can be manufactured at high production yield.

According to the present invention, the dimensions of an element can be controlled at high accuracy while a current blocking function is kept excellent. Therefore, a semiconductor laser device having excellent element characteristics can be obtained at high production yield.

Additional advantages and modifications will readily occur to those skilled in the art. Therefore, the invention in its broader aspects is not limited to the specific details, representative devices, and illustrated examples shown and described. Accordingly, departures may be made from such details without departing from the spirit or scope of the general inventive concept as defined by the appended claims an their equivalents.

What is claimed is:

1. In a semiconductor laser device comprising:
   a semiconductor substrate of a first conductivity type, double hetero structure, including a lower cladding layer of the first conductivity type,
   an active layer,
   a first upper cladding layer of $In_{1-w}(Ga_{1-y}Al_y)_wP$ of a second conductivity type, formed on said semiconductor substrate, a second upper cladding layer of $In_{1-w}(Ga_{1-z}Al_z)_wP$ of the second conductivity type partially formed on said first upper clad layer, a first contact layer of $In_{1-w}(Ga_{1-s}Al_s)_wP$ ($0 \leq s < z \leq 1$) of the second conductivity type formed on said second upper cladding layer, and a second contact layer of GaAs of the second conductivity type formed on a first upper cladding layer and said first contact layer, wherein the value of y in $In_{1-w}(Ga_{1-y}Al_y)_wP$ which constitutes said first upper cladding layer, and the value of z in $In_{1-w}(Ga_{1-z}Al_z)_wP$ which constitutes said second upper cladding layer satisfy a relation $0.6 \leq y < z \leq 1$;
   wherein the value of w in $In_{1-w}(Ga_{1-y}Al_y)_wP$ which constitutes said first upper cladding layer and $In_{1-w}(Ga_{1-z}Al_z)_wP$ which constitutes said second upper cladding layer satisfies relations $0.50 \leq w \leq 0.54$, and the value of w in $In_{1-w}(Ga_{1-s}Al_s)_wP$ in said first contact layer satisfies the relation $0 \leq w \leq 1$.

2. A device according to claim 1, wherein the values of w, s, and z in $In_{1-w}(Ga_{1-s}Al_s)_wP$ which constitutes said first contact layer satisfy relations $0.50 \leq w \leq 0.54$, and $0 \leq s \leq z \leq 1$.

3. A device according to claim 1, further comprising a layer of $In_{1-w}(Ga_{1-u}Al_u)_wP$ of the second conductivity type having a thickness of not more than 100 Å on said first upper cladding layer, wherein the value of u satisfies a relation $0 \leq u < z \leq 1$.

4. A device according to claim 1, further comprising a layer of $In_{1-w}(Ga_{1-u}Al_u)_wP$ of the second conductivity type between said first and second upper cladding layers, wherein the value of u satisfies a relation $0 \leq u < z \leq 1$.

5. A device according to claim 4, further comprising a semiconductor layer of the first conductivity type between said first upper cladding layer and said second contact layer.

6. A device according to claim 1, further comprising a buffer layer of the first conductivity type between said semiconductor substrate and said lower cladding layer.

7. A device according to claim 6, wherein said semiconductor substrate and said buffer layer comprise GaAs.

8. A device according to claim 1, wherein said lower cladding layer comprises $In_{1-w}(Ga_{1-v}Al_v)_wP$, said active layer comprises $In_{1-w}(Ga_{1-x}Al_x)_wP$, and the values of v, x, and w satisfy relations $0 \leq x \leq 1$, $0 \leq x < v \leq 1$, and $0.50 \leq w \leq 0.54$.

9. A device according to claim 1, wherein first and second electrode layers are formed on a lower surface of said semiconductor substrate and on said second contact layer, respectively.

10. A device according to claim 1, wherein the value of w in $In_{1-w}(Ga_{1-y}Al_y)_wP$ which constitutes said first upper cladding layer and $In_{1-w}(Ga_{1-z}Al_z)_wP$ which constitutes said second upper cladding layer satisfies relations $0.50 \leq w \leq 0.54$.

11. A device according to claim 1, wherein the values of w, s, and z in $In_{1-w}(Ga_{1-s}Al_s)_wP$ which constitutes said first contact layer satisfy relations $0.50 \leq w \leq 0.54$, and $0 \leq s \leq z \leq 1$.

12. In a semiconductor laser device comprising:
    a semiconductor substrate of a first conductivity type,
    a double hetero structure, including a lower cladding layer of the first conductivity type, an active layer,
    a first upper cladding layer of $In_{1-w}(Ga_{1-y}Al_y)_wP$ of a second conductivity type, formed on said semiconductor substrate, an etching stopping layer of $In_{1-w}(Ga_{1-u}Al_u)_wP$ of the second conductivity type having a thickness of not more than 100 Å on said first upper cladding layer, a second upper cladding layer of $In_{1-w}(Ga_{1-z}Al_z)_wP$ of the second conductivity type partially formed on said etching stopping layer, a first contact layer of $In_{1-w}(Ga_{1-s}Al_s)_wP$ ($0 \leq s < z \leq 1$) of the second conductivity type formed on said second upper cladding layer, and a second contact layer of GaAs of the second conductivity type formed on said etching stopping layer and said first contact layer, wherein the value of y in $In_{1-w}(Ga_{1-y}Al_y)_wP$ which constitutes said first upper cladding layer, the value of u in $In_{1-w}(Ga_{1-u}Al_u)_wP$ which constitutes said etching stopping layer, and the value z in $In_{1-w}(Ga_{1-z}Al_z)_wP$ which constitutes said second upper cladding layer satisfy relations $0.6 \leq y \leq 1$, and $0 \leq u < z \leq 1$,
    wherein the value of w satisfies the relation $0 \leq w \leq 1$.

13. A device according to claim 12, further comprising a buffer layer of the first conductivity type between said semiconductor substrate and said lower cladding layer.

14. A device according to claim 13, wherein said semiconductor substrate and said buffer layer comprise GaAs.

15. In a semiconductor laser device comprising;
    a semiconductor substrate of a first conductivity type,
    a double hetero structure, including a lower cladding layer of the first conductivity type, an active layer, and a first upper cladding layer of $In_{1-w}(Ga_{1-y}Al_y)_wP$ of a second conductivity type, formed on said semiconductor substrate, an etching stopping layer of $In_{1-w}(Ga_{1-u}Al_u)_wP$ of the second conductivity type between said first and second upper cladding layers, a second upper cladding layer of $In_{1-w}(Ga_{1-z}Al_z)_wP$ of the second conductivity type partially formed on said etching stopping layer, a first contact layer of $In_{1-w}(Ga_{1-s}Al_s)_wP$ ($0 \leq s < z \leq 1$) of the second conductivity type formed on said second upper cladding layer, and a second contact layer of GaAs of the second conductivity type formed on first upper cladding layer and said first contact layer, wherein the value of y in $In_{1-w}(Ga_{1-y}Al_y)_wP$ which constitutes said first upper cladding layer, the value of u in $In_{1-w}(Ga_{1-u}Al_u)_wP$ which constitutes said etching stopping layer, and the value of z in $In_{1-w}(Ga_{1-z}Al_z)_wP$ which constitutes said second upper cladding layer satisfy relation $0.6 \leq Y \leq 1$, and $0 \leq u \leq z \leq 1$, and wherein the value of w satisfies the relation $0 \leq w \leq 1$.

16. A device according to claim 15, further comprising a semiconductor layer of the first conductivity type between said first upper cladding layer and said second contact layer.

17. A device according to claim 15, wherein the value of w in $In_{1-w}(Ga_{1-y}Al_y)_wP$ which constitutes said first upper cladding layer and $In_{1-w}(Ga_{1-z}Al_z)_wP$ which constitutes said second upper cladding layer satisfies relations $0.50 \leq w \leq 0.54$.

18. A device according to claim 15, wherein the values of w, s, and z in $In_{1-w}(Ga_{1-s}Al_s)_wP$ which constitutes said first contact layer satisfy relations $0.50 \leq w \leq 0.54$, and $0 \leq s \leq z \leq 1$.

19. A device according to claim 15, further comprising a buffer layer of the first conductivity type between said semiconductor substrate and said lower cladding layer.

* * * * *